(12) United States Patent
Dave et al.

(10) Patent No.: US 8,832,534 B1
(45) Date of Patent: *Sep. 9, 2014

(54) LDPC DECODER ARCHITECTURE

(75) Inventors: Sameep Dave, Stow, OH (US); Fan Mo, Stow, OH (US)

(73) Assignee: ViaSat, Inc., Carlsbad, CA (US)

(*) Notice: Subject to any disclaimer, the term of this patent is extended or adjusted under 35 U.S.C. 154(b) by 352 days.

This patent is subject to a terminal disclaimer.

(21) Appl. No.: 12/984,428

(22) Filed: Jan. 4, 2011

Related U.S. Application Data (60) Provisional application No. 61/292,015, filed on Jan. 4, 2010.

(51) Int. Cl.
*H03M 13/00* (2006.01)

(52) U.S. Cl.
USPC .......................................... 714/780; 714/758

(58) Field of Classification Search
USPC ................................................ 714/758, 780
See application file for complete search history.

(56) References Cited

U.S. PATENT DOCUMENTS

| | | | |
|---|---|---|---|
| 6,829,308 B2 * | 12/2004 | Eroz et al. | 375/271 |
| 7,500,172 B2 | 3/2009 | Shen et al. | |
| 2003/0023917 A1 * | 1/2003 | Richardson et al. | 714/749 |
| 2003/0033575 A1 * | 2/2003 | Richardson et al. | 714/799 |
| 2005/0005231 A1 * | 1/2005 | Sun et al. | 714/801 |
| 2005/0204271 A1 | 9/2005 | Sharon et al. | |
| 2006/0107181 A1 * | 5/2006 | Dave et al. | 714/758 |
| 2008/0104474 A1 | 5/2008 | Gao et al. | |

OTHER PUBLICATIONS

Sankar et al., Memory-efficient Sum-product Decoding of LDPC Codes, Transactions Letters, IEEE Transactions on Communications, vol. 52, No. 8, pp. 1225-1230, Aug. 2004.

* cited by examiner

*Primary Examiner* — Joseph D Torres
(74) *Attorney, Agent, or Firm* — Holland & Hart LLP (57) ABSTRACT

Systems, devices, and methods are disclosed for a novel LDPC decoder. An architecture is described to implement a novel sequence of bit node processing (BNP) and check node processing (CNP) operations. More specifically, the BNP may be split into two parts: a BNP accumulator and a BNP extrinsic information calculator. This separation of processing modules may provide for fewer read and write operations to and from edge memory.

12 Claims, 6 Drawing Sheets

# LDPC DECODER ARCHITECTURE

CROSS-REFERENCES TO RELATED APPLICATIONS

This application claims benefit of priority under 35 U.S.C. 119(e) of U.S. Provisional Patent Application No. 61/292,015, filed on Jan. 4, 2010, entitled "LDPC DECODER ARCHITECTURE," and is related to U.S. Provisional Patent Application No. 61/292,014, filed on Jan. 4, 2010, entitled "EDGE MEMORY ARCHITECTURE FOR LDPC DECODER," the entirety of each of which is hereby incorporated by reference for all purposes.

BACKGROUND

Embodiments of the invention described herein generally relate to forward error correction (FEC) and, more specifically, to low-density parity-check (LDPC) encoding and decoding for satellite communications.

Forward error correction (FEC) is a method of transmitting redundant information with transmitted data to allow a receiver to reconstruct the data if there is an error in the transmission. At a transmitter, a structured redundancy may be added in the form of some parity bits by encoding the data. This structured redundancy may be exploited at the receiver by decoding to correct any errors introduced during transmission.

Some FEC coding schemes incorporate iterative decoding by a decoder. Turbo codes and LDPC codes are examples of coding schemes that may be iteratively decoded. However, because of the complexity of these coding schemes, there may be very significant memory and processing resources required in some implementations of the decoder. There is, thus, a need in the art to improve aspects of the performance at the decoder.

SUMMARY

Systems, devices, and methods are disclosed related to a novel LDPC decoder. An architecture is described to implement a novel sequence of bit node processing (BNP) and check node processing (CNP) operations. More specifically, the BNP may be split into two parts: a BNP accumulator and a BNP extrinsic information calculator. This separation of processing modules may provide for fewer read and write operations to and from edge memory.

An example of a communication terminal according to the disclosure includes: a decoding circuit configured to decode encoded data that has been encoded according to a coding scheme defining a parity check matrix, wherein the parity check matrix defines parity equations and edges between bit nodes and check nodes, the decoding circuit including: an input buffer configured to store channel soft information; a BNP accumulation module configured to read the channel soft information, to access extrinsic information for edges, and to generate accumulated values for edges by summing the channel soft information and the extrinsic information for edges; edge memory configured to store the accumulated values for edges generated by the BNP accumulation module; a BNP calculation module configured to access extrinsic information for edges of a previous CNP iteration and to generate extrinsic information inputs for edges for a new CNP iteration by subtracting the extrinsic information for edges of the previous CNP iteration from the accumulated values for edges stored in the edge memory; a CNP processor module configured to generate output extrinsic information for edges using the extrinsic information inputs for edges generated by the BNP calculation module; and an output buffer configured to store output data from the BNP accumulation module when a determination is made that all parity equations defined by the parity check matrix are satisfied.

Embodiments of such a communication terminal may include one or more of the following features. The CNP processor module generates the output extrinsic information for edges with an accumulation operation using as operands the extrinsic information inputs for edges generated by the BNP calculation module; and the CNP processor module is further configured to generate extrinsic information output for edges by subtracting the extrinsic information inputs for edges generated by the BNP calculation module from the output extrinsic information for edges with an inverse of the accumulation operation. The coding scheme comprises an LDPC code. The communication terminal is a satellite modem.

An example of a method for decoding encoded data that has been encoded according to a coding scheme defining a parity check matrix, the parity check matrix defining parity equations and edges between bit nodes and check nodes includes: receiving channel soft information; accessing extrinsic information for edges; generating accumulated values for edges by summing the channel soft information and the extrinsic information for edges; storing the accumulated values for edges; accessing extrinsic information for edges of a previous CNP iteration; generating extrinsic information inputs for edges for a new CNP iteration by subtracting the extrinsic information for edges of the previous CNP iteration from the stored accumulated values for edges; generating extrinsic information output for edges using the extrinsic information inputs for edges; updating the bit nodes by summing the extrinsic information output for edges associated with the respective bit nodes; determining that all parity equations defined by the parity check matrix are satisfied; and storing output bit node data.

Embodiments of such a method may include one or more of the following features. Generating the extrinsic information output for edges further includes: generating output extrinsic information for edges with an accumulation operation using as operands the extrinsic information inputs for edges; and generating the extrinsic information output for edges by subtracting the extrinsic information inputs for edges from the output extrinsic information for edges with an inverse of the accumulation operation. The coding scheme comprises an LDPC code.

An example of a communication terminal includes: a decoding circuit configured to decode encoded data that has been encoded according to a coding scheme defining a parity check matrix, wherein the parity check matrix defines parity equations and edges between bit nodes and check nodes, the decoding circuit including: a CNP processor module configured to calculate extrinsic information for all bit nodes connected by edges to respective check nodes during decoding iterations; a BNP accumulation module configured to combine channel soft information and extrinsic information from the CNP processor module to generate intermediate extrinsic information for edges; edge memory configured to store the intermediate extrinsic information for edges generated by the BNP accumulation module; and a BNP extrinsic information calculation module configured to calculate updated extrinsic information inputs for check nodes connected by edges to respective bit nodes using the intermediate extrinsic information for edges stored in the edge memory and to provide the updated extrinsic information inputs to the CNP processor module during decoding iterations.

Embodiments of such a communication terminal may include one or more of the following features. The coding scheme comprises an LDPC code. The communication terminal is a satellite modem.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This description provides example embodiments only, and is not intended to limit the scope, applicability, or configuration of the invention. Rather, the ensuing description of the embodiments will provide those skilled in the art with an enabling description for implementing embodiments of the invention. Various changes may be made in the function and arrangement of elements without departing from the spirit and scope of the invention.

Thus, various embodiments may omit, substitute, or add various procedures or components as appropriate. For instance, it should be appreciated that in alternative embodiments the methods may be performed in an order different from that described, and that various steps may be added, omitted, or combined. Also, features described with respect to certain embodiments may be combined in various other embodiments. Different aspects and elements of the embodiments may be combined in a similar manner.

It should also be appreciated that the following systems, methods, and software may individually or collectively be components of a larger system, wherein other procedures may take precedence over or otherwise modify their application. Also, a number of steps may be required before, after, or concurrently with the following embodiments.

Systems, devices, methods, and software are described for a novel LDPC decoder. An architecture is described to implement a novel sequence of bit node and check node processing operations. Example embodiments of device and system architectures are described herein with respect to LDPC codes and LDPC decoding. However, these may be adapted for other FEC coding schemes.

Figure 1:
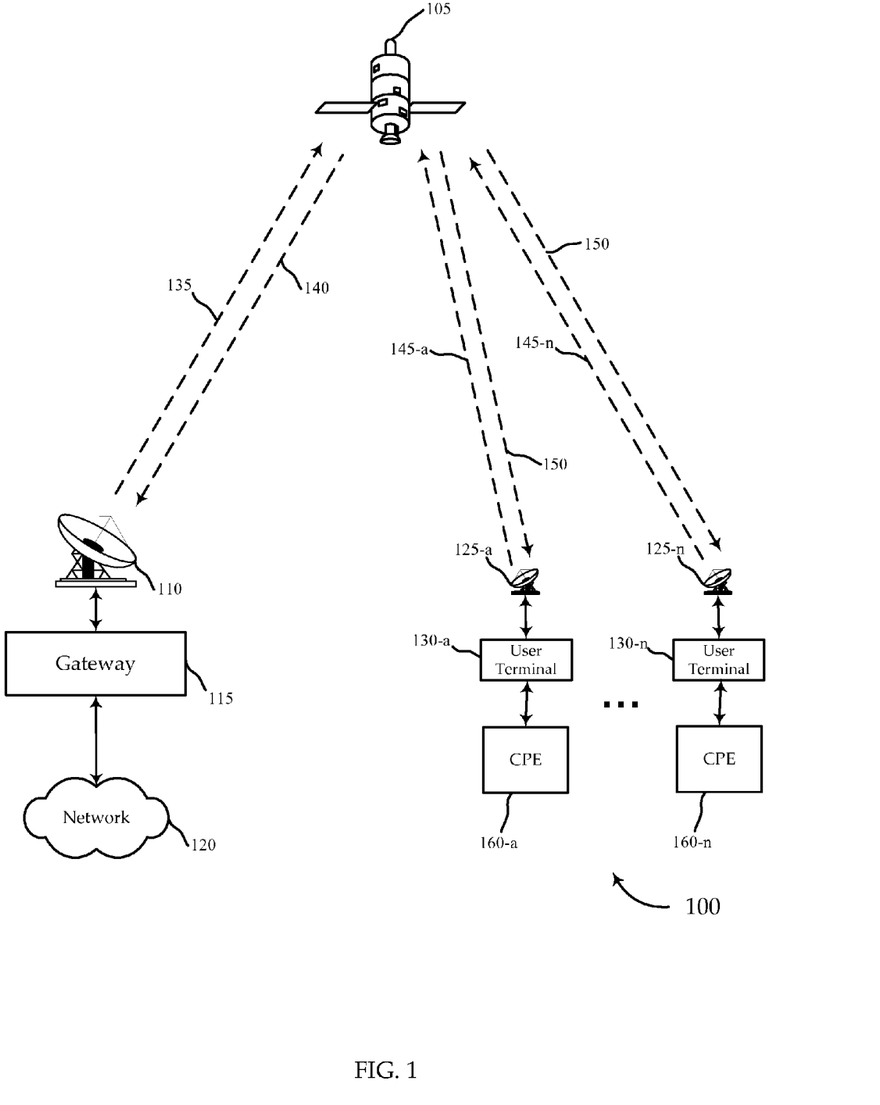
FIG. 1 is a simplified diagram of an example satellite communications system in which the methods and apparatuses of the present invention may be used.

LDPC and turbo codes are often used in satellite communications. Referring first to FIG. 1, a block diagram illustrates an example satellite communications system 100 configured according to various embodiments of the invention. While a satellite communications system is used to illustrate various aspects of the invention, it is worth noting that certain principles set forth herein are applicable to a number of other wireless systems, as well. The satellite communications system 100 includes a network 120, such as the Internet, interfaced with a gateway 115 that is configured to communicate with one or more user terminals 130, via a satellite 105.

The network 120 may be any type of network and can include, for example, the Internet, an IP network, an intranet, a wide-area network (WAN), a local-area network (LAN), a virtual private network (VPN), the Public Switched Telephone Network (PSTN), or any other type of network supporting data communication between any devices described herein. A network 120 may include both wired and wireless connections, including optical links. Many other examples are possible and apparent to those skilled in the art in light of this disclosure. The network 120 may connect the gateway 115 with other gateways (not pictured), which are also in communication with the satellite 105, and which may share information on link conditions and other network metrics.

The gateway 115 provides an interface between the network 120 and the user terminal 130. The gateway 115 may be configured to receive data and information directed to one or more user terminals 130, and format the data and signaling information for delivery downstream to the respective user terminals 130 via the satellite 105. In some embodiments, the gateway 115 may encode data to be transmitted downstream using LDPC codes.

The gateway 115 may also be configured to receive upstream signals from the satellite 105 (e.g., from one or more user terminals 130) directed to a destination in the network 120, and can format the received signals for transmission through the network 120. The novel LDPC decoding techniques herein are, in many instances, described with reference to encoding and transmission at the gateway 115, and reception and decoding at the user terminal 130. However, in other embodiments, the LDPC coding techniques herein may be applied to encoding and transmission at the user terminal 130, and reception and decoding at the gateway 115 (star) or user terminal 130 (mesh).

A device (not shown) connected to the network 120 may communicate with one or more user terminals 130 through the gateway 115. Data packets may be sent from a device in the network 120 to the gateway 115. The gateway 115 may format a series of frames in accordance with a physical layer definition for transmission to the satellite 105 via a downstream link 135. A variety of physical layer transmission modulation and coding techniques may be used with certain embodiments of the invention, including those defined with the DVB-S2 and WiMAX standards. In a number of embodiments, the gateway 115 utilizes adaptive coding and modulation (ACM) in conjunction with one or more of the LDPC coding techniques described herein (e.g., according to the DVB-S2 specification) to direct traffic to the individual terminals. The gateway 115 may use a broadcast signal, with a modulation and coding (the term "modcode" may be used interchangeably herein in exchange with "modulation and coding") format adapted for each packet to the link conditions of the user terminal 130 or set of user terminals 130 to which the packet is directed (e.g., to account for the variable service link 150 conditions from the satellite 105 to each respective user terminal 130).

The gateway 115 may use an antenna 110 to transmit the signal to the satellite 105. In one embodiment, the antenna 110 is a parabolic reflector with high directivity in the direction of the satellite and low directivity in other directions. The downstream signals 135, 150 may include, for example, one (or more) single carrier signals. Each single carrier signal may be divided in time (e.g., using Time-Division Multiple Access (TDMA) or other time-division multiplexing techniques) into a number of sub-channels. The sub-channels may be the same size, or different sizes, and a range of options will be addressed below. In some embodiments, other channelization schemes may be integrated with or used in place of time-divided sub-channels, such as Frequency-Division Multiple Access (FDMA), Orthogonal Frequency-Division Multiple Access (OFDMA), Code-Division Multiple Access (CDMA), or any number of hybrid or other schemes known in the art.

In one embodiment, a geostationary satellite 105 is configured to receive the signals from the location of antenna 110 and within the frequency band and specific polarization transmitted. The satellite 105 may, for example, use a reflector antenna, lens antenna, array antenna, active antenna, or other mechanism known in the art for reception and/or transmission of signals. The satellite 105 may process the signals received from the gateway 115 and transmit the signal from the gateway 115 to one or more user terminals 130. In one embodiment, the satellite 105 operates in a multi-beam mode, transmitting a number of narrow beams, each directed at a different region of the earth, allowing for frequency re-use. With such a multi-beam satellite 105, there may be any number of different signal switching configurations on the satellite 105, allowing signals from a single gateway 115 to be switched between different spot beams. In one embodiment, the satellite 105 may be configured as a "bent pipe" satellite, wherein the satellite 105 may frequency-convert the received carrier signals before retransmitting these signals to their destination, but otherwise perform little or no other processing on the contents of the signals. A variety of physical layer transmission modulation and coding techniques may be used by the satellite 105 in accordance with certain embodiments of the invention, including those defined with the DVB-S2 and WiMAX standards. For other embodiments, a number of configurations are possible (e.g., using LEO satellites, or using a mesh network instead of a star network), as evident to those skilled in the art.

The signals transmitted from the satellite 105 may be received by one or more user terminals 130, via the respective user antenna 125. In one embodiment, the antenna 125 and user terminal 130 together make up a very small aperture terminal (VSAT). In other embodiments, a variety of other types of antennas 125 may be used at the user terminal 130 to receive the signal from the satellite 105. The user terminals 130 may each include an implementation (or aspects of the implementation) of the novel decoder architecture disclosed herein to decode the LDPC encoded data. Each of the user terminals 130 may be a single user terminal 130 or, alternatively, be a hub or router (not pictured) that is coupled with multiple user terminals 130. Each user terminal 130 may be connected to consumer premises equipment (CPE) 160 (e.g., computers, local area networks, Internet appliances, wireless networks, etc.).

In one embodiment, a Multi-Frequency Time-Division Multiple Access (MF-TDMA) scheme is used for upstream links 140, 145, allowing efficient streaming of traffic while maintaining flexibility in allocating capacity among each of the user terminals 130. In this embodiment, a number of frequency channels are allocated which may be fixed, or which may be allocated in a more dynamic fashion. A TDMA scheme is then employed in each frequency channel. In this scheme, each frequency channel may be divided into several timeslots that can be assigned to a connection (i.e., a user terminal 130). In other embodiments, one or more of the upstream links 140, 145 may be configured with other schemes, such as TDMA, FDMA, OFDMA, CDMA, or any number of hybrid or other schemes known in the art.

A user terminal 130 may transmit information related to signal quality to the gateway 115 via the satellite 105. The signal quality may be a measured signal-to-noise ratio, an estimated signal-to-noise ratio, a bit error rate, a received power level, or any other communication link quality indicator. The user terminal 130 itself may measure or estimate the signal quality, or it may pass information measured or estimated by other devices. The user terminal 130 may specify a modcode to be used for transmission by the gateway 115 to the user terminal 130, or to the set of user terminals 130 near the user terminal 130. A user terminal 130 may also transmit data and information to a network 120 destination via the satellite 105 and gateway 115. The user terminal 130 transmits the signals via the upstream uplink 145 to the satellite 105 using the antenna 125. A user terminal 130 may transmit the signals according to a variety of physical layer transmission modulation and coding techniques, including those defined with the DVB-S2 and WiMAX standards. In various embodiments, the physical layer techniques may be the same for each of the links 135, 140, 145, 150, or may be different. The gateway 115 may, in some embodiments, use this signal quality information to implement ACM, adjusting the modcode formats to each user terminal 130 or set of user terminals 130 based on their link conditions. Thus, the gateway 115 may adapt the code rate of the LDPC codes for data to be transmitted downstream to user terminals 130.

Turning now to the use of LDPC codes in the described satellite network 100, the concept of LDPC codes may be generalized to all the linear block codes that can be represented by a sparse parity check matrix. These codes may be decoded using iterative soft-input soft-output (SISO) decoding, using one or more aspects of the novel decoder architecture described herein. It may be desirable to reduce the inherent latency and processing of the iterative process to facilitate high-data rate communications. An iteration involves two processing stages—check node processing (CNP) and bit node processing (BNP). During the CNP stage, extrinsic information and parity bits involved in a parity check equation are gathered and new extrinsic information is calculated for all the related bits. During the BNP stage, the extrinsic information corresponding to the several parity check equations for any bit is combined to provide updated output information for the next iteration. In general, the information and parity bits may be referred to as bit nodes, and the parity check equations may be referred to as check nodes. The parity check matrix can be considered as an interconnection network between bit nodes and check nodes, and every connection is defined as an edge. Aspects of the present invention relate to the storage of information in edge memory, and how the BNP and CNP are sequenced around reading from and writing to edge memory.

Figure 2:
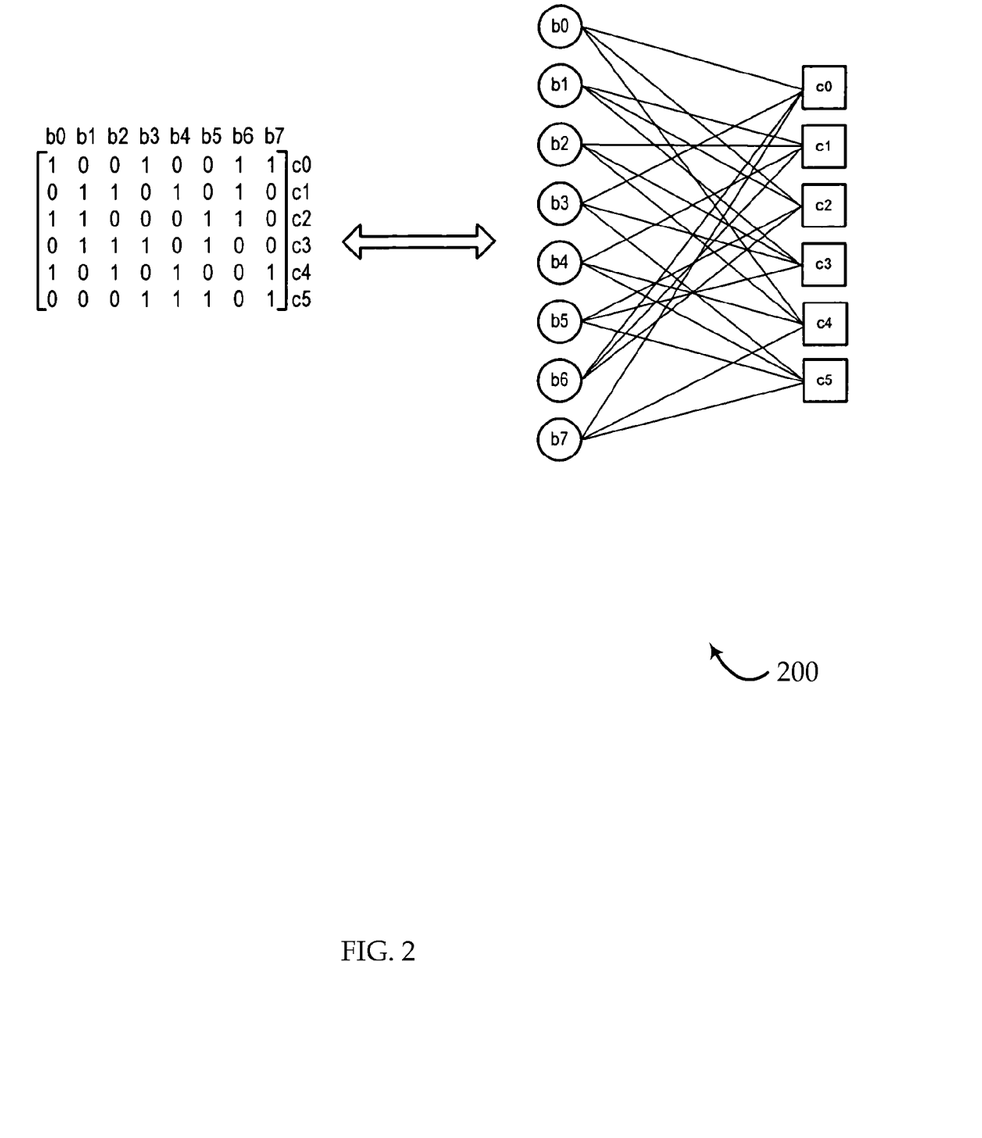
FIG. 2 is an example parity check matrix and an associated bipartite graph.

FIG. 2 is an example 200 parity check matrix A and an associated bipartite graph. In the bipartite graph, each bit node b0-b7 represents a corresponding column in the parity check matrix A, and each check node c0-c5 represents a corresponding row in the parity check matrix A. The example parity check matrix A is not an actual LDPC parity check matrix, and is provided for illustrative purposes only. Each "1" represents a bit involved in a parity check. Thus, for each code word a=[$a_0$, $a_1$, . . . $a_7$] received, the parity checks are based on:

$a_0+a_3+a_6+a_7$, $a_1+a_2+a_4+a_6$, etc. The received code word may be represented by soft information, the values of which may be used to initialize a matrix according to the parity check matrix A for iterative decoding. For example, if the soft information generated from a received code word is [0.22, 0.17, 0.78, 0.80, 0.87, 0.10, 0.25, 0.33], then an initialized matrix X according to the parity check matrix of FIG. 2 would be:

$$\begin{bmatrix} 0.22 & & & 0.80 & & & 0.25 & 0.33 \\ & 0.17 & 0.78 & & 0.87 & & 0.25 & \\ 0.22 & 0.17 & & & & 0.10 & 0.25 & \\ & 0.17 & 0.78 & 0.80 & & 0.10 & & \\ 0.22 & & 0.78 & & 0.87 & & & 0.33 \\ & & & 0.80 & 0.87 & 0.10 & & 0.33 \end{bmatrix}$$

Each connection between a bit node and a check node is an edge, and corresponds to a "1" in the parity check matrix A. Because the parity check matrix A has a column weight of 3 and a row weight of 4, each bit node is connected to three edges and each check node is connected to four edges. During the iterative decoding process, each check node provides a bit node estimate to a bit node based on information from other related bit nodes. Each bit node, in return, provides an estimate of its own value based on information from other related check nodes. The process continues until all parity check equations are satisfied, indicating a valid decode, or until a maximum number of iterations is reached without satisfying all parity check equations, indicating a decoding failure.

During decoding, a value may be assigned to each edge of a bipartite graph that is representative of a channel value associated with a bit node to which the edge is connected. Check nodes are then updated by accumulating the edge values according to a log-likelihood operation G:

$$G(a, b) = \ln \frac{1 + e^{a+b}}{e^a + e^b}.$$

Bit nodes may thereafter be updated with the update edge values by summing the edge values associated with the bit node. Thereafter, the system determines if all parity equations are satisfied or if a maximum number of iterations has been reached if all parity equations are not satisfied.

The interconnection between the bit nodes and check nodes in an LDPC code is typically pseudo-random. To facilitate high-speed decoding with reasonable complexity, a structure is often imparted in the code design so that the connections to the check nodes for a group of bit nodes are a linear translation of each other, i.e., some or all of the parity equations may be a linear translation of one particular parity equation. For example, a parity check matrix may define the following sets of linearly shifted parity check equations (1) and (2):

$$a_0 + a_8 + a_{16} + a_{32} = 0,$$

$$a_1 + a_9 + a_{17} + a_{33} = 0,$$

$$a_2 + a_{10} + a_{18} + a_{34} = 0 \quad (1)$$

$$a_0 + a_{10} + a_{20} + a_{30} = 0,$$

$$a_1 + a_{11} + a_{21} + a_{31} = 0,$$

$$a_2 + a_{12} + a_{22} + a_{32} = 0 \quad (2)$$

etc. Thus, in the linearly shifted parity check equation (1), operands $a_0$, $a_1$, and $a_2$ correspond to the first operand $a_p$, operands $a_8$, $a_9$, and $a_{10}$ correspond to the second operand $a_{p+8}$, and so on. Such a code structure facilitates parallelizing the decoding process.

Memory size and access can present unique implementation challenges. Multiple bits of soft-extrinsic information for all the edges between bit nodes and check nodes are stored. The memory for storing such information is often referred to as edge memory. Additionally, during the iterative decoding process, the bit node processors may require the original soft-input from the channel. The size of the memory depends on the block size, the resolution of soft-information, and also the average number of edges per bit, and may be relatively large for large block code sizes. Additionally, a highly-parallel decoder will read from and write to memory stores in a highly parallel fashion. Thus, for a degree of parallelism "p" the decoder may read and write p blocks of information at a time from these memories. For example, the sets of linearly shifted parity check equations (1) and (2) above define a first degree of parallelism p and a second degree of parallelism p. The values of p may differ for each degree of parallelism, e.g., the first degree of parallelism p may be 8, and the second degree of parallelism may be 16. The values of p may also be the same for some or all degrees of parallelism.

As illustrated above, powerful LDPC codes are based on complex interconnection of the bit nodes and check nodes, so gathering the data to perform highly parallel check node processing and bit node processing operations is a design challenge for efficient decoder implementation.

Figure 3:
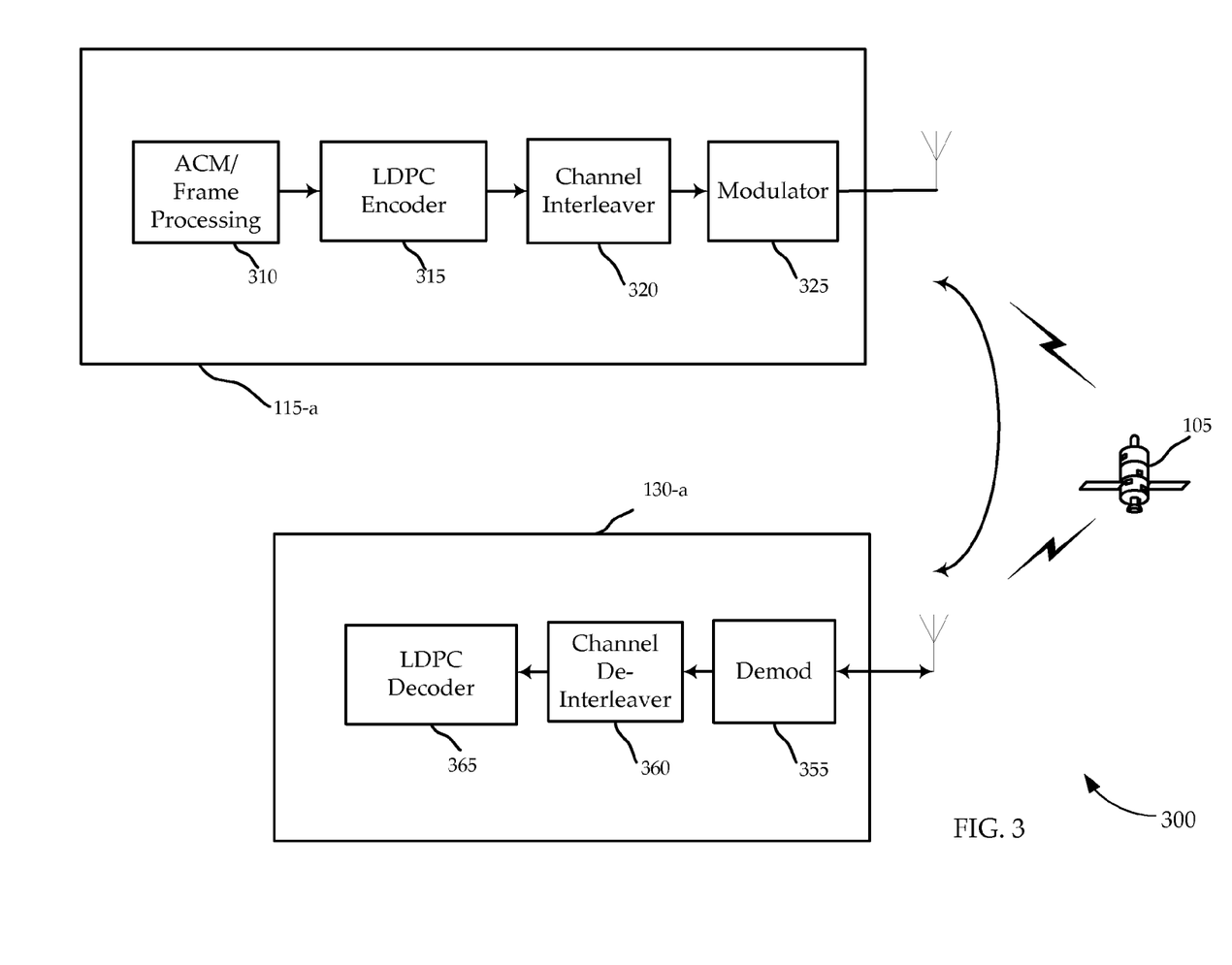
FIG. 3 is a block diagram of an example configuration of a device of the satellite communications system of FIG. 1.

Referring to FIG. 3, a block diagram is shown illustrating an example configuration 300 for certain devices of the satellite communications system 100 of FIG. 1. While the example configuration illustrates communication between a gateway 115-a and a user terminal 130-a, those skilled in the art will recognize that similar components may be used between other links for the same or other types of terminals, or between a satellite and a terminal.

In one embodiment, an initiating terminal (not shown) transmits data via a network (e.g. network 120) to the gateway 115-a for transmission downstream. The data is received by the gateway 115-a. The received data may, for example, be a series of IP packets. The gateway 115-a includes an ACM/frame processing module 310, an LDPC encoder module 315, a channel interleaver module 320, and a modulator module 325.

After some intermediate processing by other components (not shown) of the gateway 115-a, the data may be received by the ACM/frame processing module 310. The ACM/frame processing module 310 may identify, for each of the packets of the stream, a modcode format from a number of different modcode formats. The identified modcode format may be based on the link condition associated with a destination for each respective packet.

ACM/frame processing module 310 may also define a series of frames. These may be frames defined according to the DVB-S2 framing format. Thus, the frames may each include a physical layer header to be transmitted at a very robust code rate. The physical layer header may include a unique word and signaling information. The payload for each frame may be encoded using LDPC codes at the adapted code rate (based on, for example, the link condition for the destination terminal or the type of programming).

Therefore, the ACM/frame processing module 310 may set the payload size and code rate for each frame, and thus determine the amount of information that is to be forwarded to the LDPC encoder module 315 for encoding for each frame.

Figure 4:
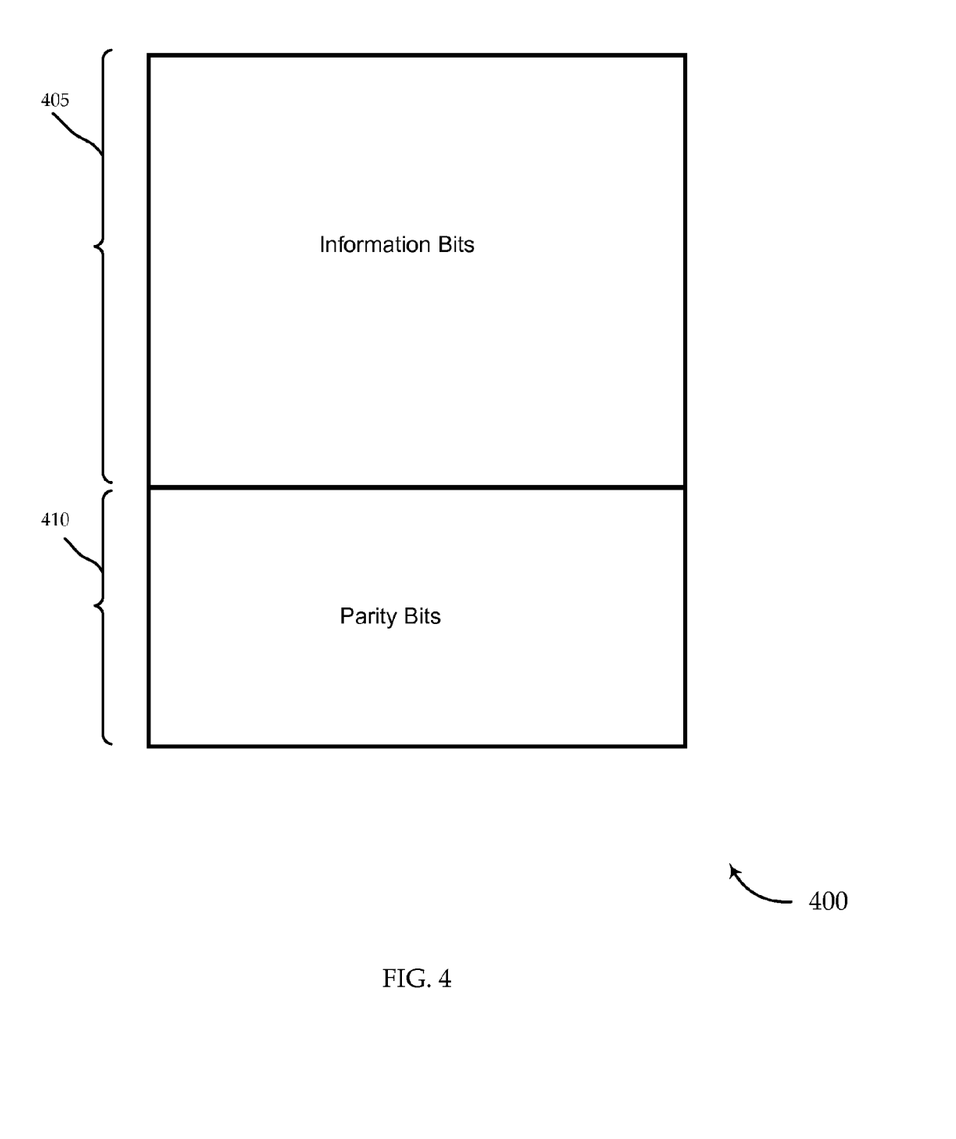
FIG. 4 is a block diagram of an example LDPC block.

Turning briefly to FIG. 4, a block diagram illustrates an example LDPC block 400 for a frame. As noted, once the payload size and code rate are known for a frame, a block size for the information bits 405 is known. ACM/frame processing module 310 may forward the information bits 405 to the LDPC encoder module 315. The LDPC encoder module 315 may then generate a set of parity bits 410 (e.g., according to the code rate and the DVB-S2 specification). Together, information bits 405 and parity bits 410 may make up the LDPC block 400 for a given frame.

Turning back to FIG. 3, the LDPC encoder 315 may forward the LDPC block 400 (which may be rearranged before transmission from the gateway 115-a to facilitate parallel processing at the decoder) for a given frame to a channel interleaver module 320 for interleaving. The channel interleaver module 320 may perform intra-block interleaving and/or inter-block interleaving, based on channel characteristics. This channel interleaving may be based on any one of a number of traditional interleaving schemes known in the art. The channel interleaver module 320 may then forward the frame with the payload to be processed by the modulator module 325 for modulation (according to the assigned modulation format and DVB-S2 specification) and transmission via a wireless signal through the satellite 105 to the user terminal 130-a.

At the user terminal 130-a, the transmitted signal is received. The user terminal 130-a in this embodiment is made up of a demodulator module 355, channel de-interleaver module 360, and LDPC decoder module 365. These components (355-365) may be implemented, in whole or in part, in hardware. Thus, they may be made up of one, or more, Application Specific Integrated Circuits (ASICs) adapted to perform a subset of the applicable functions in hardware. Alternatively, the functions may be performed by one or more other processing units (or cores), on one or more integrated circuits. In other embodiments, other types of integrated circuits may be used (e.g., Structured/Platform ASICs, Field Programmable Gate Arrays (FPGAs), and other Semi-Custom ICs), which may be programmed in any manner known in the art. Each may also be implemented, in whole or in part, with instructions embodied in a computer-readable medium, formatted to be executed by one or more general or application specific processors. Thus, the device 130-a may include different types and configurations of memory (not shown), which may be integrated into the hardware or may be one or more separate components.

The demodulator module 355 may downconvert, amplify, and demodulate the signal, thereby producing a soft-information version of the interleaved LDPC block (i.e., the block that was forwarded by the channel interleaver module 320 to the modulator module 325). This is then forwarded to the channel de-interleaver module 360, wherein the block (or blocks) are de-interleaved, thereby producing a soft-information version of the LDPC block 400 (i.e., the block that was forwarded by the LDPC encoder 315 to the channel interleaver module 320). The channel de-interleaver module 360 may forward the soft-information version of the LDPC block 400 to the LDPC decoder 365 for decoding.

Figure 5:
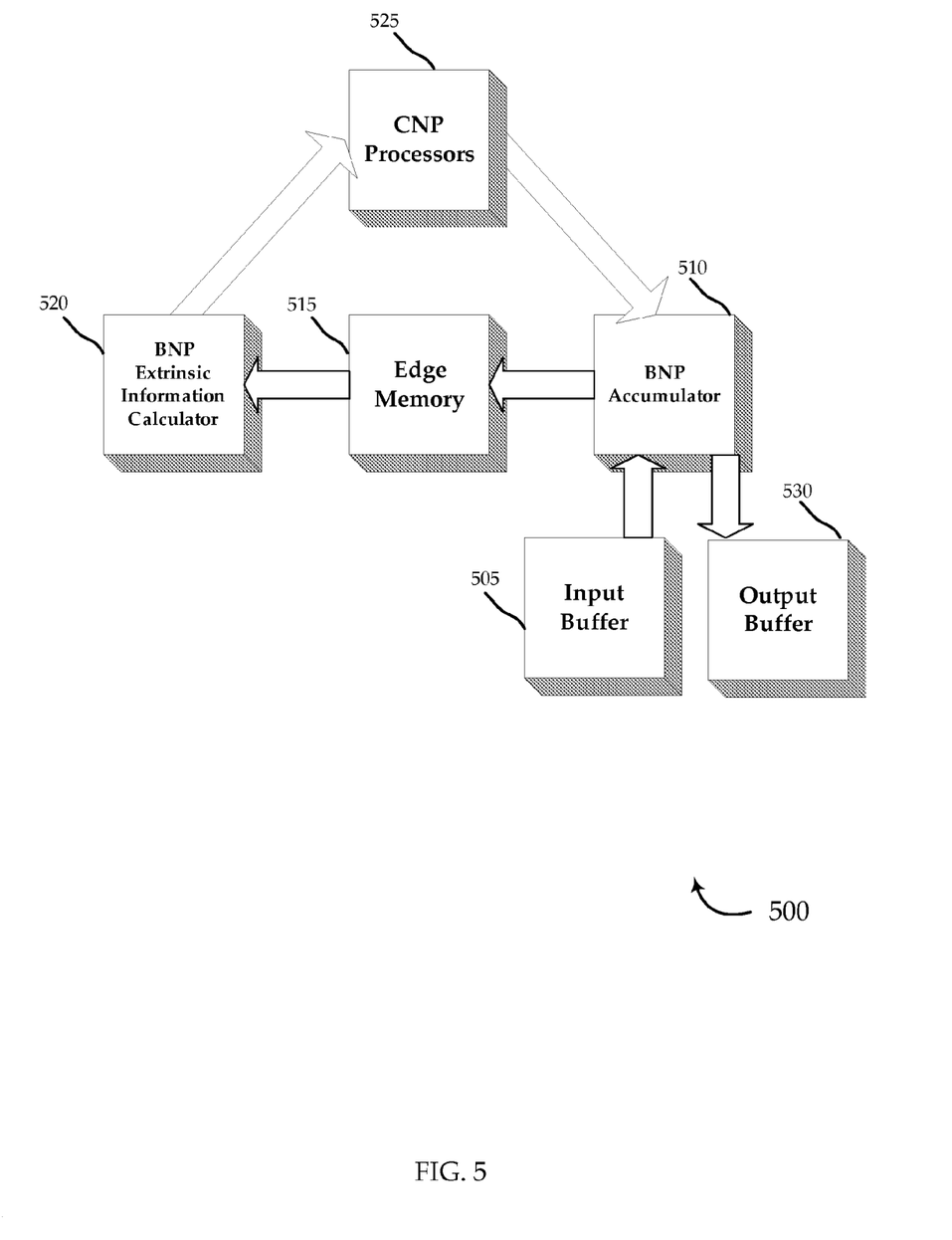
FIG. 5 is a block diagram of a more specific example of an LDPC decoder, which may be the LDPC decoder of FIG. 3.

Turning next to FIG. 5, a block diagram illustrates a more specific example of an LDPC decoder 500, which may be the LDPC decoder 365 of FIG. 3. The LDPC decoder 500 includes input buffer 505, a BNP accumulator 510, an edge memory 515, a BNP extrinsic information calculator 520, CNP processors 525, and output buffer 530. The edge memory 515 may be located at the center of the decoder 500, surrounded by CNP 525 and BNP 510, 520 processing modules with their own memories. Thus, the BNP may be split into two parts: the BNP accumulator 510 and the BNP extrinsic information calculator 520. When the CNP processors 525 are completed with processing and the edge information is ready to be written back to the edge memory 515, the BNP accumulator 510 may collect the channel information and the extrinsic information for the edges associated with a particular bit. At the other side of the of edge memory 515, the BNP extrinsic information calculator 520 may ascertain the extrinsic information from the previous CNP iteration and subtract this extrinsic information from the aggregated BNP values to create the new extrinsic information inputs for the new iteration of CNP.

As noted, the edge memory 515 may store the extrinsic information for the edges for the LDPC code. For an LDPC code block (e.g., block 400 of FIG. 4) of 64 Kb, there may be an average of three to four edges per bit. Moreover, to provide sufficient resolution for good performance, the extrinsic information for every edge may need to be a 6 bit or higher resolution number. In highly parallel designs, the edge memory 515 may need to allow massively parallel read and write ports to support BNP and CNP parallel processing. The edge memory 515 may thus need to be large and two-port, while also being very wide and not so deep. Therefore, reading from and writing to edge memory 515 can be a source of major complexity in high speed LDPC decoder designs. The novel decoder architecture herein may provide a reduced number of read/write operations to edge memory 515 when compared to conventional architectures.

Turning to a more specific example discussion of FIG. 5, the input buffer 505 is configured to store channel soft input (received, for example, from the channel de-interleaver module 360 of FIG. 3). A BNP accumulator 510 may include a parallel BNP processor array. BNP accumulator 510 receives channel soft information. BNP accumulator 510 also receives the edge values coming from the CNP processors 525, and sums these edge values with the original soft channel information $X_0$ for storage in edge memory 515. BNP extrinsic information calculator 520 accesses the edge memory 515, and generates extrinsic information for a particular edge by subtracting the original extrinsic information from the newly summed edge value of that edge. Thus, BNP extrinsic information calculator 520 subtracts extrinsic information of a previous CNP iteration from the accumulated BNP values to create the new extrinsic information inputs for the new iteration of CNP processing by the CNP processors 525.

In one embodiment, CNP involves the accumulation of values based on the log-likelihood operation G and its inverse G', where $$G(a, b) = \ln \frac{1 + e^{a+b}}{e^a + e^b}, \text{ and } G'(a, b) = \ln \frac{1 - e^{a+b}}{e^a - e^b}.$$

For any edge, the output extrinsic information is equal to the G summation of the incoming extrinsic information on all the other edges. For example, in FIG. 2, the output extrinsic information for the edge connecting bit node b0 to check node c0 is the summation of the edges between check node c0 and bit nodes b3, b6, and b7. Likewise, the output extrinsic information for the edge connecting bit node b3 to check node c0 is the summation of the edges between check node c0 and bit nodes b0, b6, and b7, and so on.

Extrinsic information output for an edge may be generated by subtracting its incoming information from the accumulated information via a G' processing block. At any check node processor, the data for the different edges can be provided serially for a pipelined implementation or in batches for a parallel implementation.

The BNP accumulator 510 thereafter updates the bit nodes with the updated edge values by summing the edge values associated with the bit node. When a determination is made that all parity equations are satisfied, output data may be stored in an output buffer 530.

Figure 6:
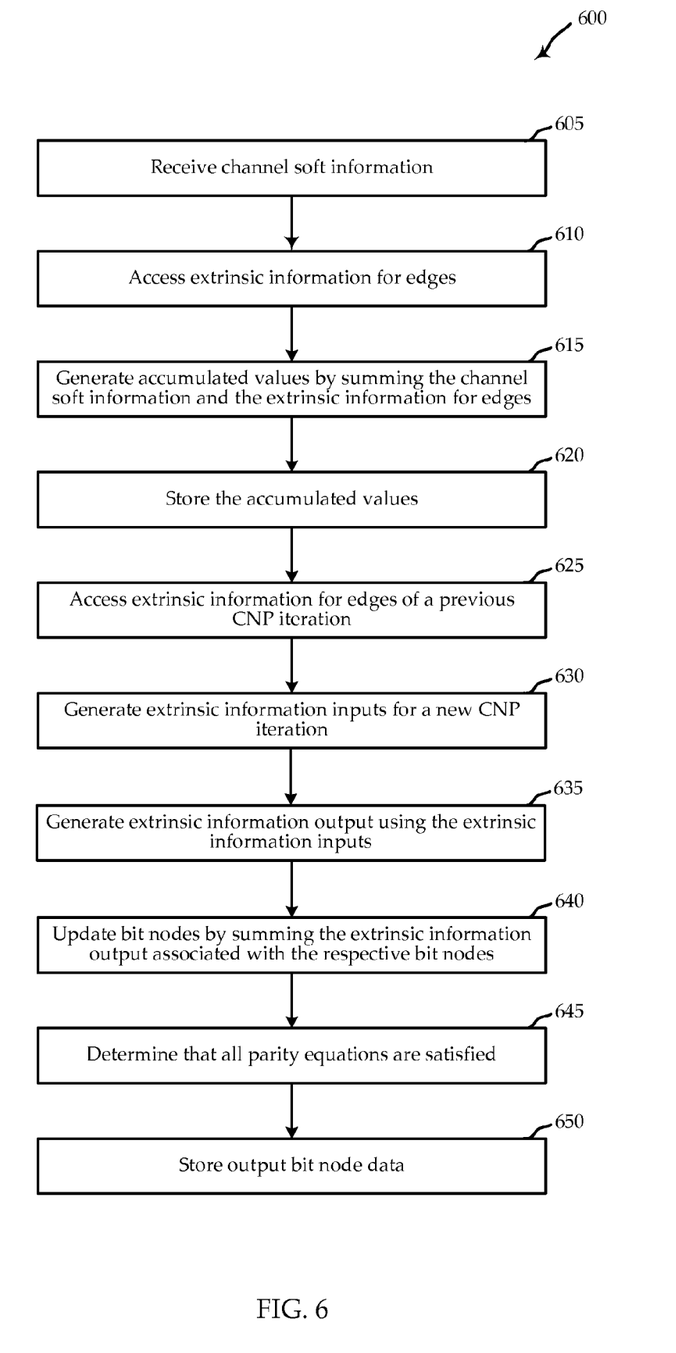
FIG. 6 is a flow diagram illustrating an example method for decoding encoded data.

The features of the various embodiments of FIGS. 3 and 5 may be implemented in a number of ways according to the specification. Further, the components and functionalities in those figures may be used to perform a number of different methods according to the specification. FIG. 6 provides a flow diagram illustrating an example method 600 for decoding encoded data that has been encoded according to a coding scheme defining a parity check matrix. The parity check matrix defines parity equations and edges between bit nodes and check nodes.

The method 600 may begin at block 605 by receiving channel soft information. Extrinsic information for edges may be accessed at block 610 (e.g., by the BNP accumulator 510 of FIG. 5). Accumulated values for edges may be generated by summing the channel soft information and the extrinsic information for edges (e.g., by the BNP accumulator 510) at block 615.

At block 620, the accumulated values for edges may be stored, for example, by the edge memory 515. The stored accumulated values for edges can be viewed as intermediate extrinsic information for edges, which are not directly used by the CNP processing module. Storing the accumulated values for edges may provide for fewer read and write operations to and from edge memory when compared to conventional decoding architectures where BNP is performed by one module.

Extrinsic information for edges of a previous CNP iteration may be accessed at block 625, e.g., by the BNP extrinsic information calculator 520. At block 630, extrinsic information inputs for edges may be generated for a new CNP iteration by subtracting the extrinsic information for edges of the previous CNP iteration from the stored accumulated values for edges (e.g., by the BNP extrinsic information calculator 520).

Extrinsic information output for edges may be generated using the extrinsic information inputs for edges at block 635, e.g., by the CNP processors 525. At block 640, the bit nodes may be updated by summing the extrinsic information output for edges associated with the respective bit nodes. For example, the BNP accumulator 510 can update the bit nodes.

In some implementations, generating the extrinsic information output for edges at block 635 includes first generating output extrinsic information for edges with an accumulation operation using as operands the extrinsic information inputs for edges. Then, the extrinsic information output for edges can be generated by subtracting the extrinsic information inputs for edges from the output extrinsic information for edges with the inverse of the accumulation operation. For example, the accumulation operation and inverse can be the log-likelihood operation G and the inverse G', respectively, as provided above.

At block 645, a determination may be made that all parity equations defined by the parity check matrix are satisfied. If it is determined that all parity equations are satisfied, output bit node data may be stored (e.g., by the output buffer 530) at block 650. If it is determined that not all parity equations are satisfied, another decoding iteration with the BNP and CNP stages can be performed. In some implementations, decoding terminates if a maximum number of decoding iterations are reached before all parity equations are satisfied.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Moreover, as disclosed herein, the term "memory" or "memory unit" may represent one or more devices for storing data, including read-only memory (ROM), random access memory (RAM), magnetic RAM, core memory, magnetic disk storage mediums, optical storage mediums, flash memory devices, or other computer-readable mediums for storing information. The term "computer-readable medium" includes, but is not limited to, portable or fixed storage devices, optical storage devices, wireless channels, a sim card, other smart cards, and various other mediums capable of storing, containing, or carrying instructions or data.

Furthermore, embodiments may be implemented by hardware, software, firmware, middleware, microcode, hardware description languages, or any combination thereof. When implemented in software, firmware, middleware, or microcode, the program code or code segments to perform the necessary tasks may be stored in a computer-readable medium such as a storage medium. Processors may perform the necessary tasks.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A communication terminal comprising:
   a decoding circuit configured to decode data that has been encoded according to a coding scheme defining a parity check matrix, wherein the parity check matrix defines parity equations and edges between bit nodes and check nodes, the decoding circuit comprising:

an input buffer configured to store channel soft information;

a bit node processing (BNP) accumulation module communicatively coupled with the input buffer and configured to read the channel soft information from the input buffer, to access extrinsic information for edges, and to generate accumulated values for edges by summing the channel soft information and the extrinsic information for edges;

an edge memory communicatively coupled with the BNP accumulation module and configured to receive and store the accumulated values for edges generated by the BNP accumulation module;

a BNP calculation module communicatively coupled with the edge memory and configured to receive the accumulated value from the edge memory, to access extrinsic information for edges of a previous check node processing (CNP) iteration, and to generate extrinsic information inputs for edges of a new CNP iteration by subtracting the extrinsic information for edges of the previous CNP iteration from the accumulated values for edges received from the edge memory;

a CNP processor module communicatively coupled with the BNP calculation module and the BNP accumulation module, and configured to receive the extrinsic information inputs for edges generated by the BNP calculation module and to generate output extrinsic information for edges from the extrinsic information inputs for edges received from the BNP calculation module, the output extrinsic information being provided to the BNP accumulation module; and an output buffer communicatively coupled with the BNP accumulation module and configured to store output data from the BNP accumulation module when a determination is made that all parity equations defined by the parity check matrix are satisfied.

2. The communication terminal of claim 1, wherein:

the CNP processor module is configured to generate the output extrinsic information for edges with an accumulation operation using as operands the extrinsic information inputs for edges received from the BNP calculation module; and the CNP processor module is further configured to generate the output extrinsic information for edges by subtracting the extrinsic information inputs for edges received from the BNP calculation module from the output extrinsic information for edges with an inverse of the accumulation operation.

3. The communication terminal of claim 1, wherein the coding scheme comprises a low-density parity-check (LDPC) code.

4. The communication terminal of claim 1, wherein the communication terminal is a satellite modem.

5. A method for decoding data in a communication terminal, wherein the data has been encoded according to a coding scheme defining a parity check matrix, and wherein the parity check matrix defines parity equations and edges between bit nodes and check nodes, the method comprising:

storing channel soft information;

generating at a first bit node processing (BNP) module, accumulated values for edges by summing the channel soft information with extrinsic information for edges;

storing the accumulated values for edges generated by the first BNP module in a memory communicatively coupled with the first BNP module;

generating at a second BNP module communicatively coupled with the memory, extrinsic information inputs for edges for a new check node processing (CNP) iteration by subtracting extrinsic information for edges of a previous CNP iteration from the accumulated values for edges, the accumulated values for edges being received at the second BNP module from the memory;

generating at a CNP module communicatively coupled with the first BNP module and the second BNP module, output extrinsic information for edges using the extrinsic information inputs for edges received at the CNP module from the second BNP module, the output extrinsic information being provided to the first BNP module; and storing an output from the first BNP module when a determination is made that all parity equations defining the parity check matrix are satisfied.

6. The method of claim 5, wherein generating the output extrinsic information further comprises:

performing an accumulation operation that uses as operands the extrinsic information inputs for edges; and subtracting the extrinsic information inputs for edges from the output extrinsic information for edges with an inverse of the accumulation operation.

7. The method of claim 5, wherein the coding scheme comprises a low-density parity-check (LDPC) code.

8. The method of claim 5, wherein the communication terminal is a satellite modem.

9. A system for decoding data in a communication terminal, wherein the data has been encoded according to a coding scheme defining a parity check matrix, wherein the parity check matrix defines parity equations and edges between bit nodes and check nodes, the system comprising:

means for storing channel soft information;

means for generating at a first bit node processing (BNP) module, accumulated values for edges by summing the channel soft information with extrinsic information for edges;

means for storing the accumulated values for edges generated by the first BNP module in a memory communicatively coupled with the first BNP module;

means for generating at a second BNP module communicatively coupled with the memory, extrinsic information inputs for edges for a new check node processing (CNP) iteration by subtracting extrinsic information for edges of a previous CNP iteration from the accumulated values for edges, the accumulated values for edges being received at the second BNP module from the memory;

means for generating at a CNP module communicatively coupled with the first BNP module and the second BNP module, output extrinsic information for edges using the extrinsic information inputs for edges received at the CNP module from the second BNP module, the output extrinsic information being provided to the first BNP module; and means for storing an output from the first BNP module when a determination is made that all parity equations defining the parity check matrix are satisfied.

10. The system of claim 9, wherein the means for generating the output extrinsic information further comprise:

means for performing an accumulation operation that uses as operands the extrinsic information inputs for edges; and means for subtracting the extrinsic information inputs for edges from the output extrinsic information for edges with an inverse of the accumulation operation.

11. The system of claim 9, wherein the coding scheme comprises a low-density parity-check (LDPC) code.

12. The system of claim 9, wherein the communication terminal is a satellite modem.

* * * * *